(12) United States Patent
Eiring

(10) Patent No.: US 8,001,681 B2
(45) Date of Patent: Aug. 23, 2011

(54) ASSEMBLY IDENTIFICATION BY MOUNTING CONFIGURATION

(75) Inventor: Chad D. Eiring, Delaware, OH (US)

(73) Assignee: Liebert Corporation, Columbus, OH (US)

( * ) Notice: Subject to any disclaimer, the term of this patent is extended or adjusted under 35 U.S.C. 154(b) by 913 days.

(21) Appl. No.: 11/400,124

(22) Filed: Apr. 7, 2006

(65) Prior Publication Data

US 2006/0226711 A1    Oct. 12, 2006

Related U.S. Application Data

(60) Provisional application No. 60/670,108, filed on Apr. 11, 2005.

(51) Int. Cl.
*H05K 3/36* (2006.01)
*H05K 3/30* (2006.01)

(52) U.S. Cl. .................. 29/830; 29/832; 29/834

(58) Field of Classification Search .......... 29/832, 29/830, 834; 361/600–602, 622, 627, 641, 361/673, 679.01–679.02, 728, 748, 760–762, 361/807, 823, 825

See application file for complete search history.

(56) References Cited

U.S. PATENT DOCUMENTS

| | | | | |
|---|---|---|---|---|
| 5,536,981 | A * | 7/1996 | Sato et al. | 307/116 |
| 5,951,659 | A * | 9/1999 | McElroy et al. | 710/300 |
| 5,961,352 | A * | 10/1999 | Denny et al. | 439/637 |
| 6,030,230 | A * | 2/2000 | Peacock | 439/61 |
| 6,477,603 | B1 * | 11/2002 | Locker et al. | 710/301 |
| 6,504,725 | B1 * | 1/2003 | Lam | 361/785 |
| 6,587,354 | B1 * | 7/2003 | Kutsch et al. | 361/788 |
| 7,136,290 | B1 * | 11/2006 | Wise | 361/788 |
| 2004/0178318 | A1 * | 9/2004 | Li | 248/694 |

* cited by examiner

*Primary Examiner* — A. Dexter Tugbang
*Assistant Examiner* — David P Angwin
(74) *Attorney, Agent, or Firm* — Locke Lord Bissell & Liddell LLP

(57) ABSTRACT

The present disclosure provides a method for identification of an electronic assembly, when used multiple times in a larger system, to change its location status in a system based on its mounting configuration. The mounting configuration dictates the identification and thus reduces incorrect identification settings and the need for complicated installation instructions. In at least one embodiment, the identification is determined by the location of a fastener, such as a grounding fastener, on the assembly.

10 Claims, 4 Drawing Sheets

ASSEMBLY IDENTIFICATION BY MOUNTING CONFIGURATION

This application claims the benefit of U.S. Provisional Application No. 60/670,108, filed Apr. 11, 2005.

FIELD

This disclosure relates to electronic assemblies. More specifically, the disclosure relates to assembly identification in an electronic system.

BACKGROUND

The reliance on electronic assemblies in electronic systems is universal. Electronic assemblies, such as electronic boards, are preformed and mounted or otherwise integrated into the electronic systems. For manufacturing efficiency, the same electronic assemblies are often used in multiple locations. Further, some electronic assemblies can be reconfigured to function in different modes. Proper identification of the location and configuration of the assembly along a communication bus in the electronic system is essential to the proper functioning of the overall system.

Currently, assemblies can be mounted in the assembly and identified on the communication bus by DIP switches or jumpers. An assembler then manually sets the DIP switches or jumpers to a predetermined setting based on instructions for the particular identification of the assembly. These switches or jumpers set an offset so that other portions of the electronic system on the bus know where the assembly is located within the overall system or how the assembly is to function. If the switches or jumpers are not set or incorrectly set, the overall system will typically be unable to identify or function properly.

U.S. Pat. No. 5,536,981 teaches a circuit card mounting shelf apparatus having an automatic identification number setting function without necessitating an artificial operation, such as setting DIP switches. Different electrical connection input/output terminals are wired differently (FIG. 5) for each of the respectively different circuit boards. The different wiring on the circuit boards (apparently short-circuiting different terminals) in conjunction with wiring on the shelf apparatus provides the automatic identification number so that the different boards can perform their intended function. Thus, the same cards are not used in multiple places.

Therefore, there remains a need for improvement in the ready identification of an electronic assembly in a system, especially for the same electronic assembly used in multiple locations in the system.

SUMMARY

The present disclosure provides a method and system for identification of an electronic assembly, when used multiple times in a larger system, to change its location status in a system based on its mounting configuration. The mounting configuration dictates the identification and thus reduces incorrect identification settings and the need for complicated installation instructions. In at least one embodiment, the identification is determined by the location of a fastener, such as a grounding fastener, on the assembly.

In at least one embodiment, the disclosure provides a system for using a plurality of same electronic assemblies in a plurality of predetermined locations within an electronic system for performing a function and establishing different identities for the electronic assemblies depending on mounting locations, comprising: a first electronic assembly adapted to be mounted to the electronic system in a first location, wherein an identity of the first electronic assembly is established by one or more mounting conductive paths between the electronic assembly and the electronic system through one or more mounts that are used to couple the electronic assembly with the electronic system.

The disclosure can also provide a method of establishing an identity for each of a plurality of electronic assemblies through one or more mounts that allow mounting of the electronic assemblies with an electronic system, comprising: positioning a first electronic assembly in an orientation relative to the mounts at a first location in the electronic system; coupling the first electronic assembly to the electronic system with one or more conductive fasteners in conjunction with the one or more mounts to establish one or more mounting conductive paths and uniquely identify the first electronic assembly with the system at the first location; mounting a second electronic assembly functionally interchangeable with the first electronic assembly at a second location different than the first location, both locations having an interchangeable arrangement of mounts for coupling the electronic assemblies with the electronic system; and establishing an identity of the second electronic assembly by one or more conductive paths between the second electronic assembly and the electronic system through one or more mounts at the second location that are different relative to the one or more mounts at the first location.

The disclosure can further provide a system for using a plurality of same electronic assemblies in a plurality of predetermined locations within an electronic system for performing a function and establishing different identities for the electronic assemblies depending on mounting locations, comprising: a first electronic assembly adapted to be mounted to the electronic system in a first location, wherein an identity of the first electronic assembly is established through a first conductive fastener used to couple the first electronic assembly with the electronic system through a first mount selected from a plurality of mounts at the first location; and a second electronic assembly interchangeable with the first electronic assembly and adapted to be mounted to the electronic system at a second location different than the first location, both locations having an interchangeable arrangement of mounts that are used to couple the electronic assemblies with the electronic system, and wherein an identity of the second electronic assembly is established through a second conductive fastener used to couple the second electronic assembly with the electronic system through a second mount selected from a plurality of mounts at the second location, the second mount relative to other mounts at the second location being different that the first mount relative to other mounts at the first location.

BRIEF DESCRIPTION OF THE DRAWINGS

A more particular description, briefly summarized above, may be had by reference to the embodiments illustrated in the appended drawings, forming part of the present specification and described herein. It is to be noted, however, that the appended drawings illustrate only some embodiments described herein and are therefore not to be considered limiting of the disclosure's scope, in that there can be other equally effective embodiments.

DETAILED DESCRIPTION

Figure 1:
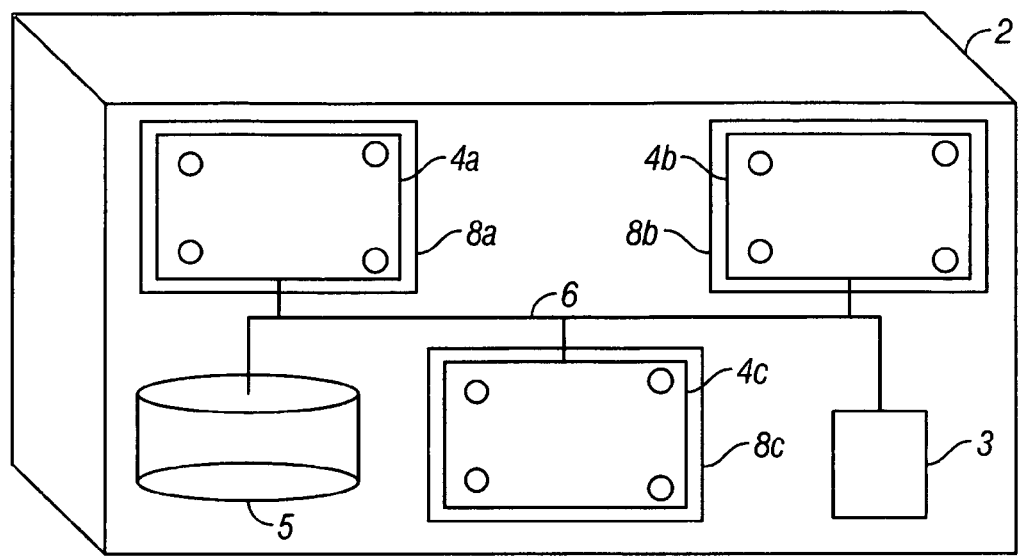
FIG. 1 is a perspective schematic view of one embodiment of an electrical system having an electronic assembly mounted therein.
Figure 1A:
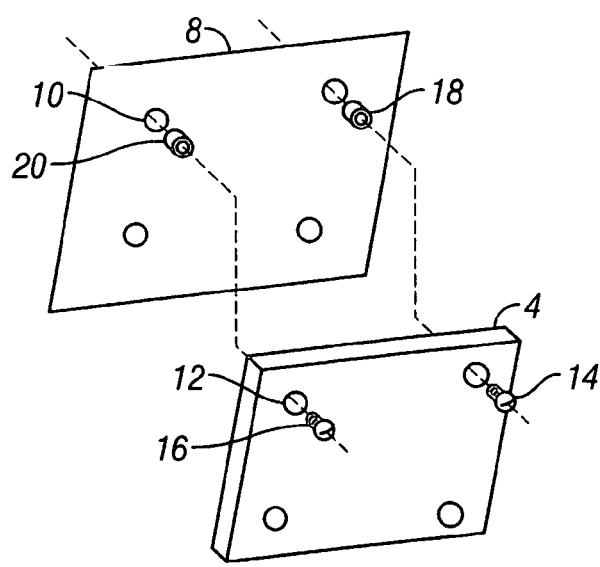
FIG. 1A is a perspective assembly schematic view of a mounting location of the system with a board.

FIG. 1 is a perspective schematic view of one embodiment of an electrical system having an electronic assembly mounted therein. FIG. 1A is a perspective assembly schematic view of a mounting location of the system with a board. The figures will be described in reference to each other. An electronic system 2 generally has one or more electronic assemblies 4a, 4b, 4c (generally "4") coupled to a communication bus 6, where the assemblies are sometimes referred to herein as "boards". The term "board" is used broadly and encompasses electronic assemblies, regardless of shape and function, that are part of an electronic system to perform one or more functions, including but not limited to, processing, communication, or other functions generally found in electronic systems. In at least one embodiment, the boards can be the same board used at multiple locations, for example, to communicate on different aspects of the system's status. The term "communication bus" is used broadly and includes any system or method of communication between multiple electronic assemblies in an electronic system. The communication bus provides an interconnectivity between multiple portions of the electronic system and enables the electronic system to perform its intended function.

In at least one embodiment, the system 2 is designed to accept the boards at predetermined mounting locations 8a, 8b, 8c (generally "8") and provide mounts, so that the boards can be mounted therewith. In at least one embodiment, the system 2 includes one or more system mounts 10. The system mounts are in a constant spacing relative to each other. Similarly, the board 4 has a plurality of board mounting openings 12 to align with the system mounts 10. Alignment between the mounts 10 and the openings 12 is a constant. While in at least one embodiment, the mounts are on the system and the openings are formed in the boards, it is understood that the mounts can be formed on the board and the openings on the system, or a combination thereof. Generally, the arrangement of the mounts 10 and the openings 12 will be asymmetric, so that the board can be mounted in only one orientation relative to the mounts. This single alignment further reduces needed instructions and operator error.

At least one conductive fastener 14 can couple the board 4 with the system 2 by use of the mounts 10 and openings 12. The term "fastener" is used broadly and includes any device or system that can be used to couple two elements together. For example, a fastener can be a screw, wire, clasp, protrusion, receiver, or other coupling device, whether conductive or non-conductive. In some embodiments, a conductive standoff 18, also shown in FIG. 3, can be used. The conductive fastener also forms a mounting conductive path between the board 4 and the system 2. In a preferred embodiment, the indicated location and/or function of the board 4 (the "identity" of the board) to the system depends simply on which opening(s) in the board and mounts of the system are used to couple therebetween. Further, in at least one embodiment, the conductive fastener can assist in forming a ground connection between the board and the system. Multiple conductive fasteners can be used, such as at diagonals, but it is believed such will complicate the mounting and thus complicate the easily established identity of the board with the system.

To change the indicated identity of the board 4 to the system 2, the conductive fastener 14 can be simply moved to a different board mounting opening 12 in conjunction with the corresponding system mount 10 relative to other mounts at that location 8. The board and/or system recognizes the different location of the mounting conductive path and establishes a different identity for the board relative to the system. In at least one embodiment, the position of the board can be uniquely identified by only one mounting conductive path, for example, if the board is mountable in only one orientation. Further, in at least one embodiment, other board mounting opening(s) 12 and the corresponding system mount(s) can be coupled by non-conductive fastener(s) 16 and/or non-conductive standoff(s) 20.

Figure 2:
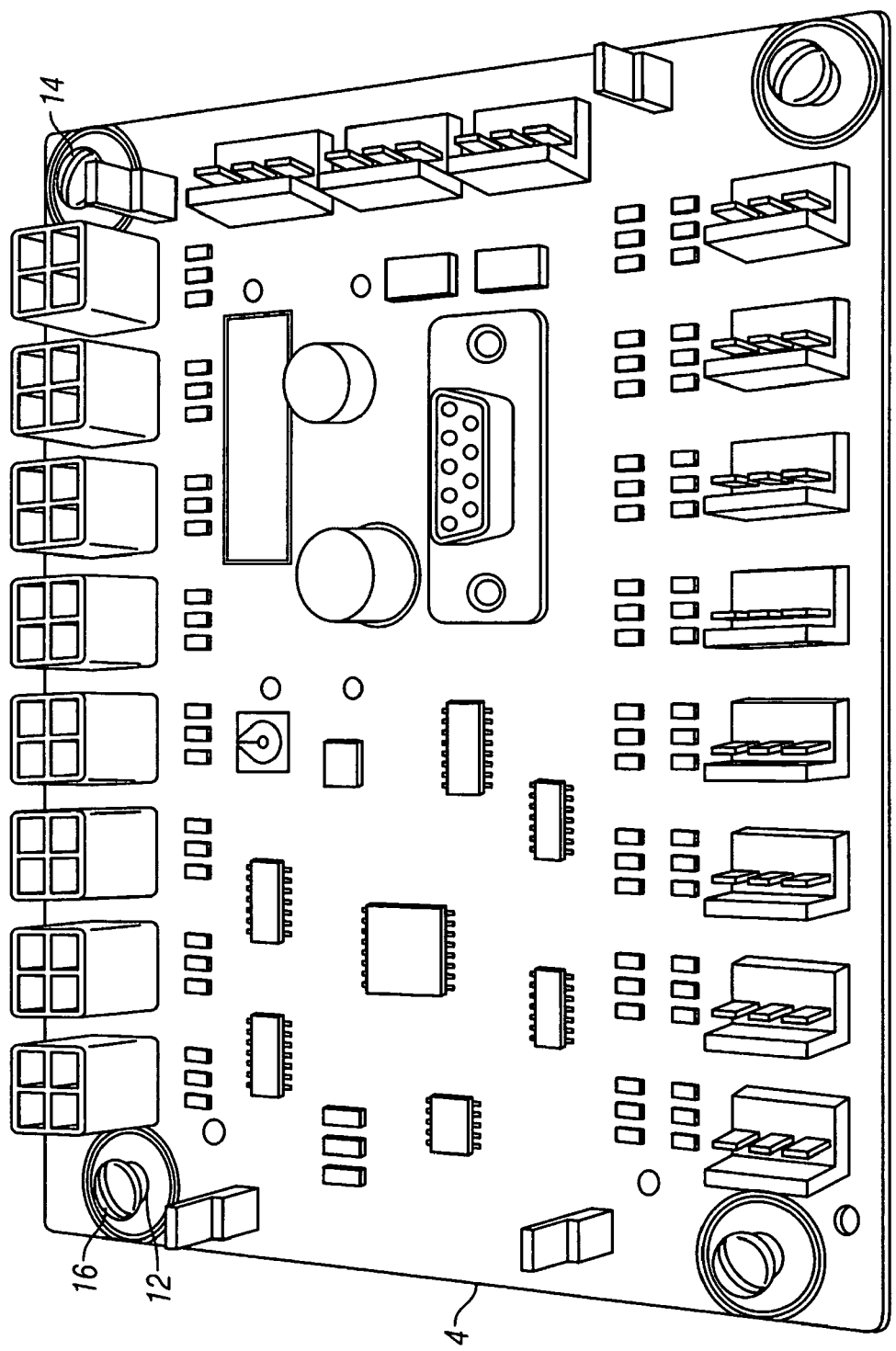
FIG. 2 is a top perspective schematic view of one embodiment of the electronic assembly.
Figure 3:
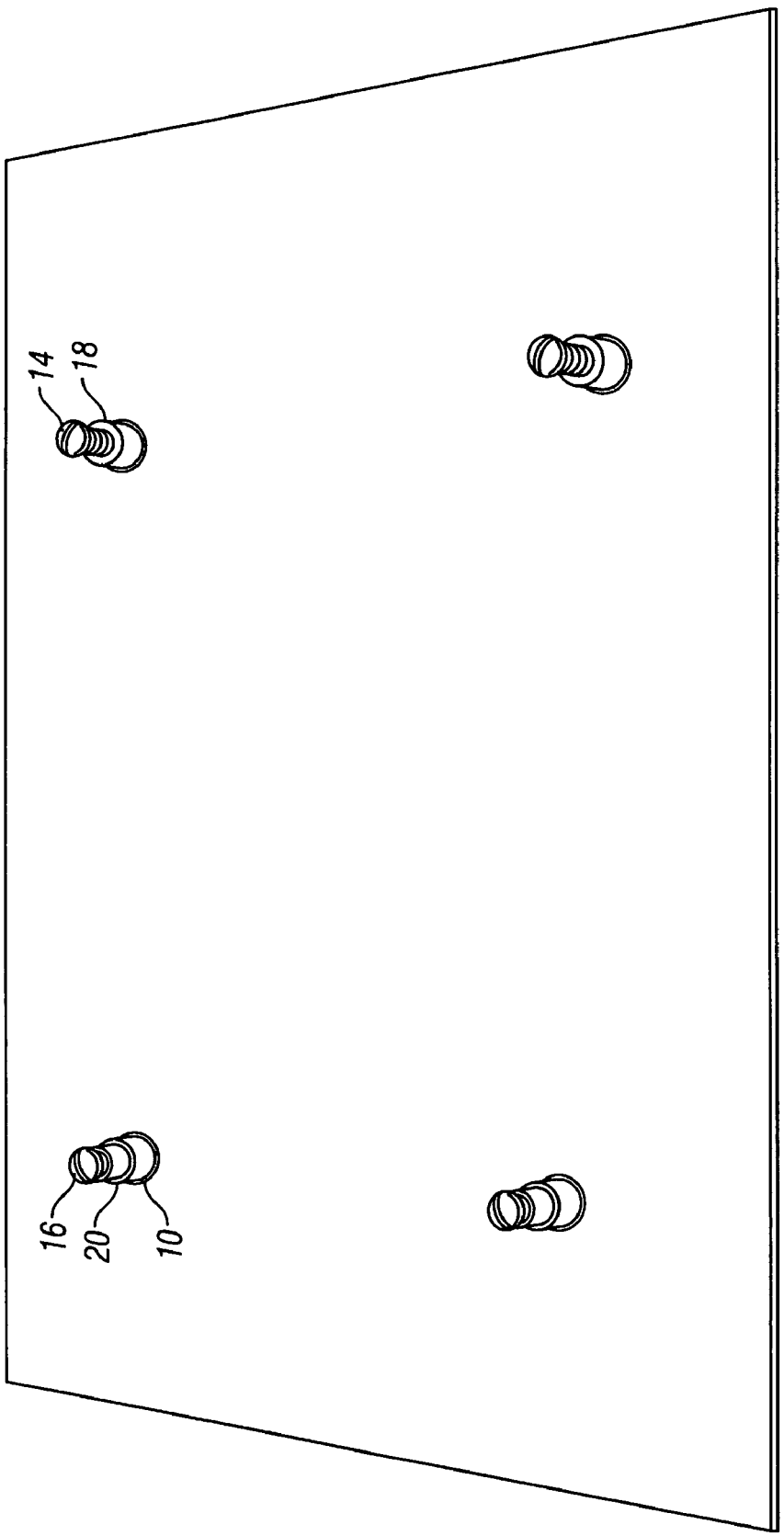
FIG. 3 is a top perspective schematic view of the electronic assembly of FIG. 2, illustrating an arrangement of standoffs.

FIG. 2 is a top perspective schematic view of one embodiment of the electronic assembly. FIG. 3 is a top perspective schematic view of the electronic assembly of FIG. 2, illustrating an arrangement of standoffs between the board 4 and the system 2. The figures will be described in conjunction with each other.

The board 4 generally has a plurality of board mounting openings 12. The coupling of a particular board mounting opening 12 in conjunction with a corresponding system mount 10, shown in FIG. 1A, can be used to establish the identity of the board with the system 2. To assist in maintaining proper orientation of the board 4, the board mounting openings 12 can be asymmetric to allow only one mounting orientation relative to the system mounts 10.

In at least one embodiment, the same board 4 can be used in multiple locations in the system 2 (FIG. 1). However, different mounting positions of a conductive fastener 14 through the use of different board mounting openings 12 and corresponding system mounts 10 establishes different identities for the board in different locations. Other board mounting openings 12 can be used to couple the board 4 to the system 2 with other corresponding system mounts 10 through one or more non-conductive fasteners 16.

In general, standoffs can be used with the fasteners to separate the board 4 from unintentional contact with the system 2. For example, a conductive standoff 18 will generally be used with the conductive fastener 14 and a non-conductive standoff 20 will generally be used with a non-conductive fastener 16. Thus, a combination of non-conductive standoffs 20 and conductive standoffs 18 on the board in conjunction with different board mounting openings and their corresponding system mounts can affect the identity of the board. When the arrangement of the conductive path is known by use of fasteners and/or standoffs, no complicated instructions or onsite changes are necessary.

Generally, the factory designs the system 2 with one or more appropriate locations of the board 4 in the system. System mounts 10 are formed in the system at the appropriate locations to receive the boards 4. In at least one embodiment, the factory advantageously provides conductive and non-conductive standoffs preassembled to the system mounts 10 that correspond to the appropriate arrangement and intended identity of the board 4 for that location. Alternatively, the factory can provide the standoffs preassembled to the board in the proper arrangement to assist in establishing an identity for the board. Further, the standoffs can be provided separately with instructions such as a diagram of the proper arrangement of standoffs for the particular location of the board relative to the system. Still further, standoffs need not be used, if additional contact between the board and the system will not adversely affect the identity of the board.

Minimal directions need be given to the installer to couple the board with the system. The same board can be used in multiple locations, where the installer can install a conductive fastener to couple the board 4 with the system 2 using the proper opening. The proper opening can be readily identified by the presence and/or absence of the conductive standoff(s), if provided, or by a diagram or other indicia indicating the intended location of the fastener(s) for the particular board identity relative with the system. The particular arrangement of standoffs and/or fasteners when the board 4 is coupled to the system 2 establishes the board identity in the system.

Figure 4:
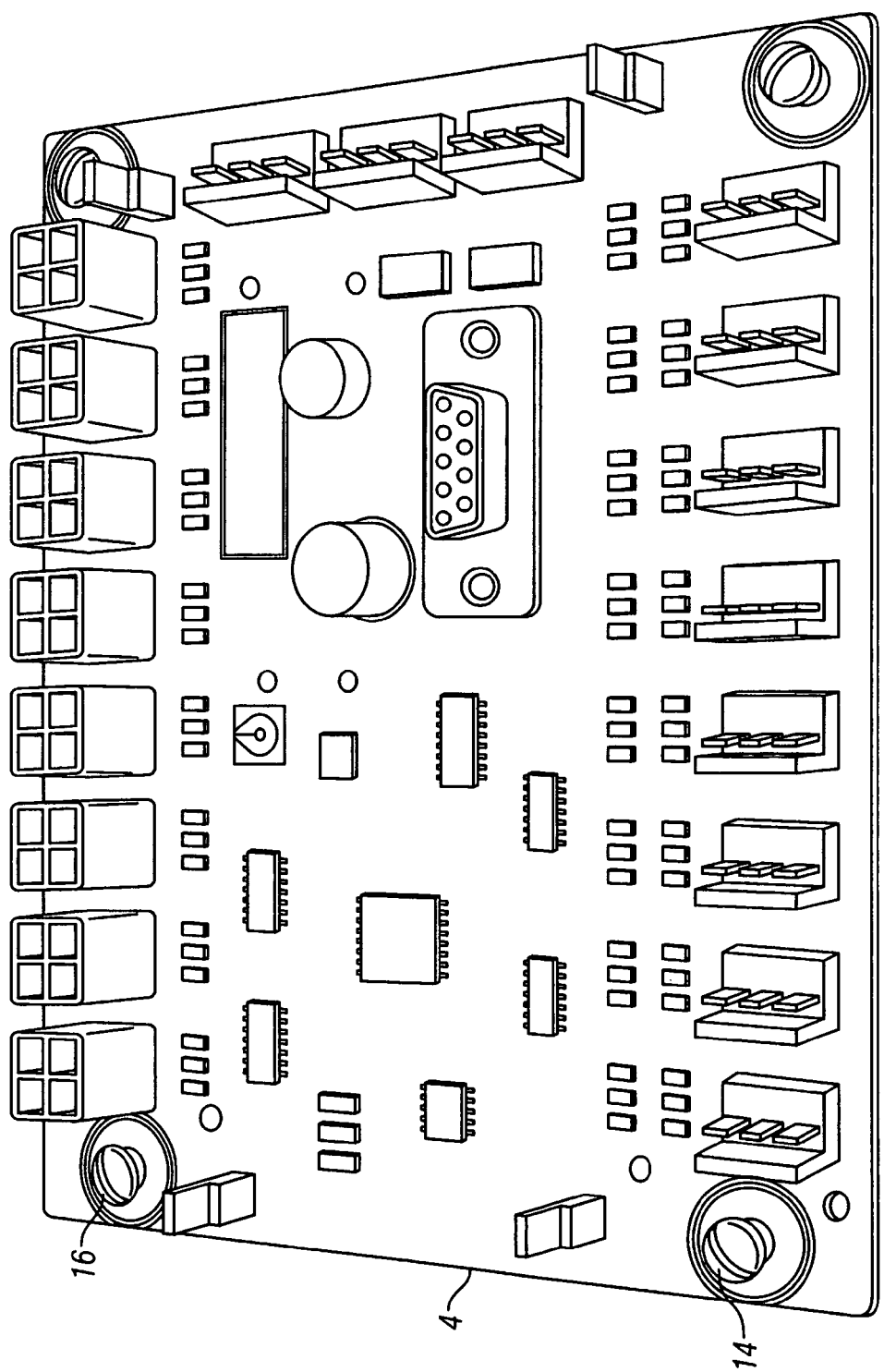
FIG. 4 is a top perspective schematic view of the electronic assembly of FIG. 2, illustrating an alternative arrangement of a conductive path between the board and the system.

FIG. 4 is a top perspective schematic view of the electronic assembly of FIG. 2, illustrating an alternative arrangement of a mounting conductive path between the board and the system. For example, the mounting conductive path can be made through the conductive fastener 14 in conjunction with a different mount relative to the other mounts at a location. The different relative mount compared to the mount used by the conductive fastener in FIG. 2 establishes a different identity for the electronic assembly at that location. In this disclosure, the board 4 can be the same board as in FIGS. 2 and 3 and even perform the same function, including but not limited to, monitoring, communicating, sensing the status of system components at different locations. By the term "same", the multiple boards have the same critical mounting configuration and generally the same critical hardware, firmware, and/or circuitry, even though some differences, such as notches, colors, accessories, and markings can be present. However, the identification of the board in the system generally can be established by the simple location of the mounting conductive path between the board and the system.

Various basics of the invention have been explained herein. The various techniques and devices disclosed represent a portion of that which those skilled in the art would readily understand from the teachings of this application. Variations are possible and contemplated and are limited only by the claims. Details for the implementation thereof can be added by those with ordinary skill in the art. Such details may be added to the disclosure in another application based on this provisional application and it is believed that the inclusion of such details does not add new subject matter to the application. The accompanying figures may contain additional information not specifically discussed in the text and such information may be described in a later application without adding new subject matter. Additionally, various combinations and permutations of all elements or applications can be created and presented. All can be done to optimize performance in a specific application.

The various steps described herein can be combined with other steps, can occur in a variety of sequences unless otherwise specifically limited, various steps can be interlineated with the stated steps, and the stated steps can be split into multiple steps. Unless the context requires otherwise, the word "comprise" or variations such as "comprises" or "comprising", should be understood to imply the inclusion of at least the stated element or step or group of elements or steps or equivalents thereof, and not the exclusion of any other element or step or group of elements or steps or equivalents thereof.

Further, any documents to which reference is made in the application for this patent as well as all references listed in any list of references filed with the application are hereby incorporated by reference. However, to the extent statements might be considered inconsistent with the patenting of this invention such statements are expressly not to be considered as made by the applicant(s).

Also, any directions such as "top," "bottom," "left," "right," "upper," "lower," and other directions and orientations are described herein for clarity in reference to the figures and are not to be limiting of the actual device or system or use of the device or system. The device or system may be used in a number of directions and orientations.

The invention claimed is:

1. A method of establishing an identity for one or more electronic assemblies through one or more mounts that allow mounting of each electronic assembly with an electronic system having a plurality of locations for mounting electronic assemblies, each assembly having a plurality of mounting openings thereon, the method comprising:

positioning a first assembly relative to a plurality of mounts at a first system location so that each of the plurality of mounting openings is aligned with a corresponding mount, thereby configuring the first assembly to be conductively coupled to the first system location via any one of the plurality of mounting openings and its corresponding mount;

coupling the first assembly to the first system location by coupling a conductive fastener with at least one mounting opening and corresponding mount, thereby establishing a mounting opening having a mounting conductive path between the first assembly and the system; and electronically recognizing with the first assembly which of the mounting openings at the first system location has the mounting conductive path, thereby establishing a first unique identity for the first assembly.

2. The method of claim 1, further comprising:

uncoupling the first assembly from the system;

positioning the first assembly relative to a plurality of mounts at a second system location so that at least one mounting opening is aligned with a corresponding mount, the second system location being different from the first system location;

coupling the first assembly to the second system location by coupling a conductive fastener with the at least one aligned mounting opening and corresponding mount, thereby establishing a mounting opening having a mounting conductive path between the first assembly and the system, the mounting opening having the mounting conductive path at the second system location being different from the mounting opening having the mounting conductive path at the first system location; and recognizing which of the mounting openings has the mounting conductive path, thereby establishing a second unique identity for the first assembly.

3. The method of claim 1, further comprising:

uncoupling the first assembly from the system;

positioning the first assembly relative to a plurality of mounts at a second system location so that at least one mounting opening is aligned with a corresponding mount, the second system location being different from the first system location;

coupling the first assembly to the second system location by coupling a conductive fastener with the at least one aligned mounting opening and corresponding mount, thereby establishing a mounting opening having a mounting conductive path between the first assembly and the system, the mounting opening having the mounting conductive path at the second system location being the same as the mounting opening having the mounting conductive path at the first system location; and recognizing which of the mounting openings has the mounting conductive path, thereby reestablishing the first unique identity for the first assembly.

4. The method of claim 1, wherein the mounting conductive path is at least a portion of a ground connection between the first assembly and the system.

5. The method of claim 1, further comprising recognizing the location of the first assembly within the system relative to one or more other of the plurality of locations in the system.

6. The method of claim 1, further comprising:
positioning a second assembly relative to a plurality of mounts at a second system location so that at least one mounting opening is aligned with a corresponding mount;
coupling the second assembly to the second system location by coupling a conductive fastener with the at least one mounting opening and corresponding mount, thereby establishing a mounting opening having a mounting conductive path between the second assembly and the system; and
recognizing which of the mounting openings has the mounting conductive path, thereby establishing a first unique identity for the second assembly.

7. The method of claim 1, wherein each mounting opening aligns with a corresponding mount at the first system location only when the first assembly is oriented in a specific orientation, and wherein the method further comprises positioning the first assembly in the specific orientation.

8. The method of claim 1, further comprising:
coupling a conductive fastener to a corresponding mount at each of the plurality of mounting openings, thereby forming a first arrangement of mounting conductive paths; and
establishing the first unique identity for the first assembly by recognizing the location of each mounting conductive path in the first arrangement.

9. The method of claim 1, comprising communicating the first unique identity from the first assembly to the system.

10. The method of claim 1, further comprising:
uncoupling the first assembly from the first system location;
coupling a second assembly to the first system location in place of the first assembly; and
establishing a first unique identity for the second assembly at the first system location, the first unique identity for the second assembly being the same as the first unique identity for the first assembly.

\* \* \* \* \*